US010497645B2

(12) United States Patent
Qian et al.

(10) Patent No.: US 10,497,645 B2
(45) Date of Patent: Dec. 3, 2019

(54) SEMICONDUCTOR DEVICES

(71) Applicant: Samsung Electronics Co., Ltd., Suwon-si, Gyeonggi-do (KR)

(72) Inventors: Yubo Qian, Yongin-si (KR); Byung Sung Kim, Suwon-si (KR); Hyeon Uk Kim, Seoul (KR); Young Gook Park, Seongnam-si (KR); Chul Hong Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/244,137

(22) Filed: Jan. 10, 2019

(65) Prior Publication Data

US 2019/0148292 A1    May 16, 2019

Related U.S. Application Data

(63) Continuation of application No. 15/894,968, filed on Feb. 13, 2018, now Pat. No. 10,217,705.

(30) Foreign Application Priority Data

Aug. 1, 2017  (KR) .......................... 10-2017-0097542

(51) Int. Cl.
    *H01L 21/768*  (2006.01)
    *H01L 23/532*  (2006.01)
    *H01L 23/522*  (2006.01)
    *H01L 23/528*  (2006.01)

(52) U.S. Cl.
    CPC .... *H01L 23/5226* (2013.01); *H01L 21/76805* (2013.01); *H01L 21/76808* (2013.01); *H01L 21/76843* (2013.01); *H01L 21/76852* (2013.01); *H01L 23/5283* (2013.01); *H01L 23/53295* (2013.01); *H01L 2221/1031* (2013.01)

(58) Field of Classification Search
    CPC .......... H01L 23/5226; H01L 21/76805; H01L 21/76808; H01L 21/76843
    USPC ....................................................... 257/774
    See application file for complete search history.

(56) References Cited

U.S. PATENT DOCUMENTS

| 6,300,683 B1 | 10/2001 | Nagasaka et al. |
| 6,680,247 B2 | 1/2004 | Ueno |
| 6,787,907 B2 | 9/2004 | Watanabe et al. |
| 7,807,567 B2 | 10/2010 | Kawano et al. |
| 8,546,949 B2 | 10/2013 | Oryoji et al. |
| 9,406,589 B2 | 8/2016 | Ting |
| 2013/0292841 A1 | 11/2013 | Lai et al. |
| 2015/0084196 A1 | 3/2015 | Riess et al. |
| 2016/0027733 A1 | 1/2016 | Bao et al. |

FOREIGN PATENT DOCUMENTS

| JP | 2010-278330 B2 | 12/2010 |
| JP | 2014-056991 A | 3/2014 |

*Primary Examiner* — Elias Ullah
(74) *Attorney, Agent, or Firm* — Myers Bigel, P.A.

(57) ABSTRACT

A semiconductor device includes a first conductive element, a first insulating layer and a second insulating layer sequentially disposed on the first conductive element, a conductive via passing through the first insulating layer and the second insulating layer. The conductive via is connected to the first conductive element. The semiconductor device includes a via extension portion disposed in the second insulating layer that extends along an upper surface of the first insulating layer from one side surface of the conductive via, and a second conductive element disposed on the second insulating layer that is connected to the via extension portion.

20 Claims, 14 Drawing Sheets

SEMICONDUCTOR DEVICES

CROSS-REFERENCE TO RELATED APPLICATION

This application is a continuation of and claims priority to U.S. application Ser. No. 15/894,968, filed on Feb. 13, 2018, which claims the benefit of priority to Korean Patent Application No. 10-2017-0097542, filed on Aug. 1, 2017 in the Korean Intellectual Property Office, the disclosure of each of which is incorporated herein by reference in its entirety for all purposes.

BACKGROUND

1. Technical Field

Aspects of the present disclosure relate to semiconductor devices, including semiconductor devices having interconnection structures.

2. Description of Related Art

Various semiconductor devices, such as a logic circuit and a memory, may use a structure for interconnecting a variety of conductive elements, such as a conductive line of a back end of line (BEOL) and a contact plug, such as a source or a drain, connected to an active region, positioned on different levels, to each other in a vertical direction.

Recently, due to a high degree of integration of semiconductor devices, a line width and/or pitch may be reduced or a routing may become complicated, and an undesired short circuit between the conductive element and a component adjacent thereto due to such an interconnection structure may occur, or a sufficient interconnection area (or a contact area) may not be secured. Thus, contact resistance may increase.

SUMMARY

Aspects of the present disclosure may provide semiconductor devices having novel interconnection structures allowing a sufficient interconnection area to be secured without changing design particulars of adjacent components.

According to an aspect of the present disclosure, a semiconductor device may include: a first conductive element; a first insulating layer and a second insulating layer sequentially disposed on the first conductive element; a conductive via passing through the first insulating layer and the second insulating layer, the conductive via connected to the first conductive element; a via extension portion disposed in the second insulating layer, the via extension portion extending along an upper surface of the first insulating layer from one side surface of the conductive via; and a second conductive element disposed on the second insulating layer, the second conductive element connected to the via extension portion.

According to an aspect of the present disclosure, a semiconductor device may include: a first conductive element; a first insulating layer disposed on the first conductive element; a first sub-via disposed in the first insulating layer, the first sub-via being connected to the first conductive element; a second insulating layer disposed on the first insulating layer; an etch stop layer disposed between the first insulating layer and the second insulating layer; a second sub-via disposed in the second insulating layer, the second sub-via connected to an upper surface of the first sub-via, and the second sub-via having an extension portion thereof extending along an upper surface of the etch stop layer; and a second conductive element disposed on the second insulating layer, the second conductive element connected to the second sub-via.

According to an aspect of the present disclosure, a semiconductor device may include: a substrate having a device separation region that defines an active region; an interlayer insulating layer disposed in the active region; a contact plug disposed in the interlayer insulating layer, the contact plug being connected to the active region; a first insulating layer and a second insulating layer sequentially disposed on the interlayer insulating layer; an etch stop layer disposed between the first insulating layer and the second insulating layer; a conductive via passing through the first insulating layer and the second insulating layer, the conductive via connected to the contact plug; a via extension portion disposed in the second insulating layer, the via extension portion extending along the etch stop layer from one side surface of the conductive via; and a conductive line disposed on the second insulating layer, the conductive line connected to the via extension portion.

BRIEF DESCRIPTION OF DRAWINGS

The above, and other aspects, features, and advantages of the present disclosure will be more clearly understood from the following detailed description when taken in conjunction with the accompanying drawings, in which.

DETAILED DESCRIPTION

Hereinafter, example embodiments of the inventive concepts presented herein will be described in detail with reference to the attached drawings.

Figure 1:
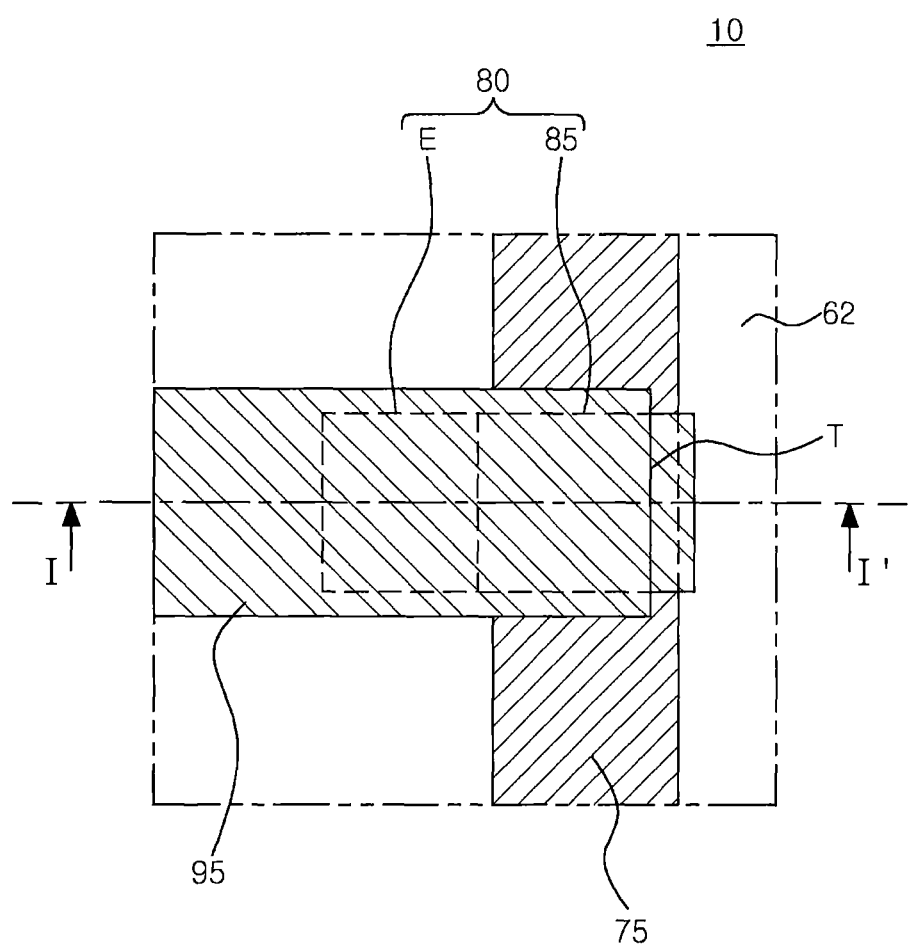
FIG. 1 is a plan view illustrating primary components of a semiconductor device, according to example embodiments.
Figure 2:
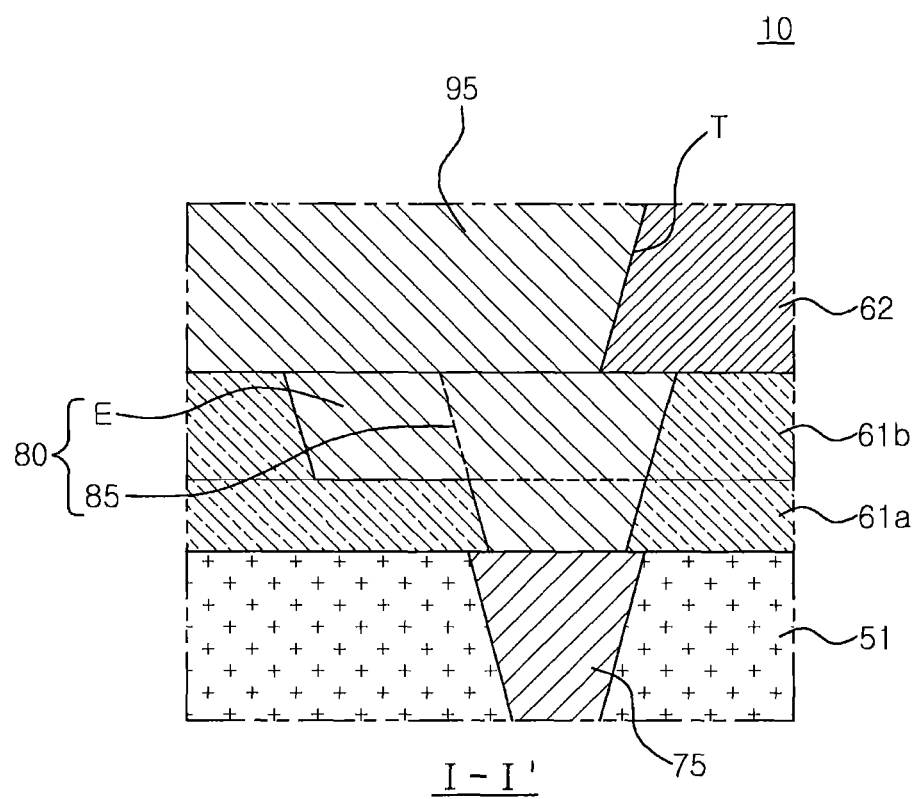
FIG. 2 is a cross-sectional view of the semiconductor device taken along line I-I' of FIG. 1.

FIG. 1 is a plan view illustrating primary components of a semiconductor device, according to example embodiments. FIG. 2 is a cross-sectional view of the semiconductor device taken along line I-I' of FIG. 1.

Referring to FIGS. 1 and 2, a semiconductor device 10, according to an example embodiment, may include a first conductive element 75 and a second conductive element 95 positioned on different levels, and a via structure 80 connecting the first conductive element 75 to the second conductive element 95.

The first conductive element 75 may be one component of the semiconductor device 10, and may be, for example, a contact plug connected to an active region (for example, a source or drain region), or a conductive line (for example, a metal line) extending in one direction. The second conductive element 95 may be a conductive line, such as a metal line of a back end of line (BEOL).

As illustrated in FIG. 2, the semiconductor device 10 may include an upper insulating layer 62 having the second conductive element 95 disposed therein, a lower insulating layer 51 having the first conductive element 75 disposed therein, and first and second insulating layers 61a and 61b disposed therebetween the upper and lower insulating layers 62 and 51.

For example, the lower insulating layer 51 may include a tetraethyl orthosilicate (TEOS) layer, an undoped silicate glass (USG) layer, a phosphosilicate glass (PSG) layer, a borosilicate glass (BSG) layer, a borophosphosilicate glass (BPSG) layer, a fluoride silicate glass (FSG) layer, a spin-on glass (SOG) layer, a tonen silazene (TOSZ) layer, or combinations thereof The first and second insulating layers 61a and 61b may be low-k layers. For example, each of the first and second insulating layers 61a and 61b may be a SiOC layer, a SiCOH layer, or combinations thereof. The upper insulating layer 62 may also be a low-k layer similar thereto.

The via structure 80 employed in an example embodiment may be disposed in the first and second insulating layers 61a and 61b. As illustrated in FIG. 2, the via structure 80 may include a conductive via 85 passing through the first and second insulating layers 61a and 61b and connected to the first conductive element 75, and a via extension portion E disposed in the second insulating layer 61b and extending from one side surface of the conductive via 85.

As illustrated in FIG. 1, the second conductive element 95 may be positioned in a particular direction or may extend in the particular direction, based on the conductive via 85. The via extension portion E may extend from the side surface of the conductive via 85 in the direction of the second conductive element 95 to be adjacent to the second conductive element 95.

The via extension portion E may extend along an upper surface of the first insulating layer 61a, and may provide an upper surface connected to an upper surface of the conductive via 85. The via structure 80 may have an upper surface in which the upper surface of the conductive via 85 may be combined with the upper surface of the via extension portion E. Thus, the via structure 80 may have a contactable expanded area (that is, an upper surface area) while retaining a size of a lower surface thereof.

The second conductive element 95 disposed in the upper insulating layer 62 may be connected to the via extension portion E. In an example embodiment, the second conductive element 95 may extend over the upper surface of the via extension portion E to the upper surface of the conductive via 85.

As described above, the addition of the via extension portion E may significantly increase an interconnection area between the via structure 80 and the second conductive element 95. As a result, a level of contact resistance may be reduced.

Further, in an example embodiment, the via extension portion E extending in a direction adjacent to that of the second conductive element 95 may allow a sufficient contact area to be secured. Thus, the second conductive element 95 may not extend further past the via structure 80 (or the conductive via 85). As illustrated in FIGS. 1 and 2, a tip T of the second conductive element 95 may be positioned on the via structure 80 (or the conductive via 85). Thus, without changing a line width and/or a pitch or a path, an undesired short circuit between the second conductive element 95 and a component adjacent thereto may be less likely to occur.

Figure 3:
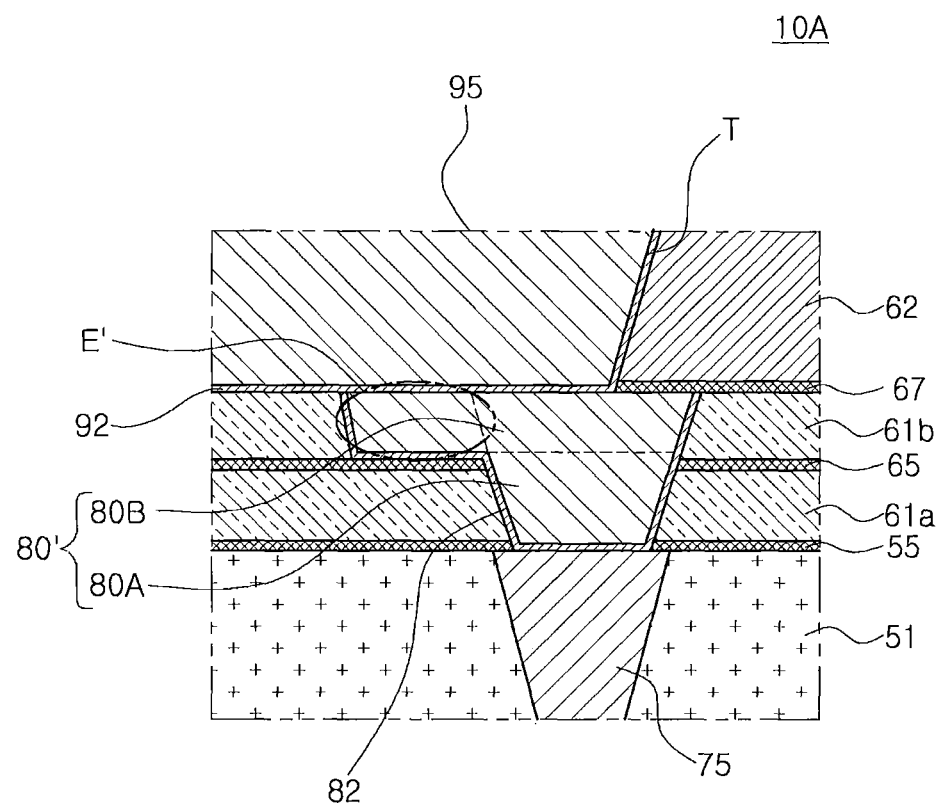
FIGS. 3 and 4 are cross-sectional views of semiconductor devices, according to various example embodiments.
Figure 4:
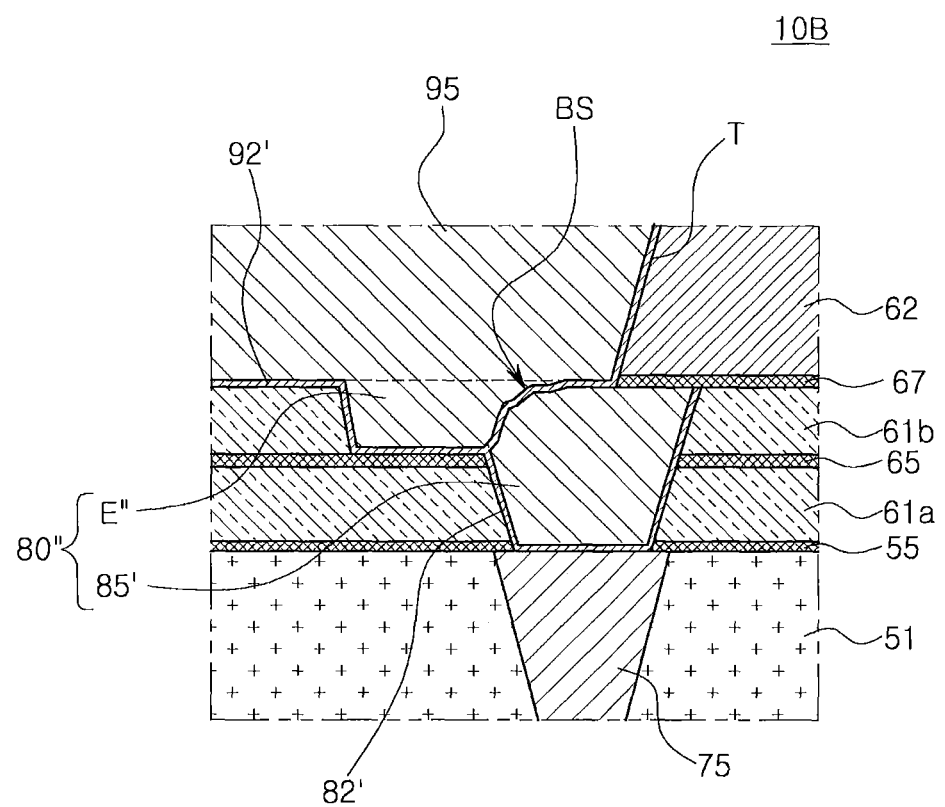

FIGS. 3 and 4 are cross-sectional views of semiconductor devices, according to various example embodiments, in which etch stop layers may be employed. A via extension portion may be formed using an etch stop layer disposed between first and second insulating layers.

Referring first to FIG. 3, a semiconductor device 10A, according to an example embodiment, may include a first conductive element 75 and a second conductive element 95 positioned on different levels, and a via structure 80' connecting the first conductive element 75 to the second conductive element 95. The semiconductor device 10A may be understood as having a structure similar to that of the previous example embodiment (FIG. 2), excluding the via structure 80'. The description of the previous example embodiment may be combined with that of the present example embodiment, unless otherwise stated.

As illustrated in FIG. 3, the semiconductor device 10A may include a first etch stop layer 55 disposed between a lower insulating layer 51 and a first insulating layer 61a, a second etch stop layer 65 disposed between the first insulating layer 61a and a second insulating layer 61b, and a third etch stop layer 67 disposed between the second insulating layer 61b and an upper insulating layer 62.

The first etch stop layer 55 may prevent a metal (for example, Cu or W) component constituting a via structure and a metal line, or a process gas component used in a process of forming a via structure and a metal line from diffusing to a lower region. The first etch stop layer 55 may be formed of a silicon nitride. However, the present disclosure is not limited thereto. For example, the first etch stop layer 55 may be formed of an aluminum nitride (AlN). The second and third etch stop layers 65 and 67 may include a silicon nitride, such as $SiN_x$, or an aluminum nitride. If desired, the third etch stop layer 67 may be removed, or may be optional.

Similar to the via structure 80 of FIG. 2, the via structure 80' employed in an example embodiment may comprise a conductive via passing through the first and second insulating layers 61a and 61b, and a via extension portion or extended portion E' disposed in the second insulating layer 61b and extending from the conductive via. As illustrated in FIG. 3, the via structure 80' may comprise a first sub-via 80A disposed in the first insulating layer 61a, and a second sub-via 80B disposed in the second insulating layer 61b.

The second sub-via 80B may be connected to an upper surface of the first sub-via 80A, and may have the extended portion E' extending along an upper surface of the second etch stop layer 65. The second etch stop layer 65 may define a position of a lower surface of the extended portion F. The extended portion E' may be formed in a direction in which the second conductive element 95 may be disposed or may extend.

In an example embodiment, an upper surface of the second sub-via 80B may be substantially coplanar with an upper surface of the extended portion E'. The extended portion may allow the second sub-via 80B to provide an upper surface (for example, a contact area) greater than the upper surface of the first sub-via 80A.

The second sub-via 80B having the extended portion E' may form an integrated structure along with the first sub-via 80A. The term "integrated structure" used herein may refer to a single structure including the same material, and may be formed using, for example, a single filling process.

As described above, a side surface and lower surfaces of the via structure 80', the integrated structure, may be surrounded by a first conductive barrier 82. This may show that the first sub-via 80A, and the second sub-via 80B having the extended portion E' may be formed using the single filling process. For example, the first conductive barrier 82 may include a metal nitride, such as TiN, TaN, or WN.

The second conductive element 95 disposed in the upper insulating layer 62 may be connected to the second sub-via 80B, and may contact the extended portion E'. An additional second conductive barrier 92 may be disposed on a lower surface and a side surface of the second conductive element 95. A tip T of the second conductive element 95 may be positioned on the upper surface of the second sub-via 80B. As described above with respect to FIG. 2, even when the tip T of the second conductive element 95 is formed on the upper surface of the second sub-via 80B, the extended portion E' may allow the second conductive element 95 and the second sub-via 80B to have a sufficient contact area therebetween.

Referring to FIG. 4, a semiconductor device 10B, according to an example embodiment, may have a structure similar to that of the example of FIG. 3, with a difference being that FIG. 4 has a via structure 80". The description of the example of FIG. 3 may be combined with that of the present example embodiment, unless otherwise stated.

The via structure 80" may be described as being divided into a conductive via 85' passing through first and second insulating layers 61a and 61b, and a via extension portion E" disposed in the second insulating layer 61b and extending from one side surface of the conductive via 85'.

The semiconductor device 10B, according to an example embodiment, may include a first conductive barrier 82' surrounding a lower surface and a side surface of the conductive via 85', and a second conductive barrier 92' surrounding a lower surface and a side surface of the via extension portion E". The via extension portion E" may extend from the side surface of the conductive via 85' toward the second conductive element 95 to be adjacent to the second conductive element 95. Similar to the via extension portions E or E' discussed above, the via extension portion E" may be formed along an upper surface of a second etch stop layer 65. The via structure 80" may have an upper surface expanded by a combination of an upper surface of the conductive via 85' and an upper surface of the via extension portion E".

In an example embodiment, the via extension portion E" and the second conductive element 95 may form an integrated structure. The second conductive barrier 92' may extend along a side surface of the second conductive element 95 and a lower surface of the second conductive element 95 disposed on the second insulating layer 61b. In the integrated structure, the second conductive element 95 may be in contact with the upper surface of the via extension portion E".

In an example embodiment, the conductive via 85' and the via extension portion E" may be separated by the second conductive barrier 92'. As illustrated in FIG. 4, a portion of the second conductive barrier 92' may be positioned at an interface BS between the conductive via 85' and the via extension portion E". The interface BS between the conductive via 85' and the via extension portion E" may be an upwardly inclined surface. For example, the interface BS may be a non-uniform surface obtained using an etching process (refer to FIG. 6C).

As described above, in an example embodiment, a sufficient contact area between the via structure 80" and the second conductive element 95 may be secured by the via extension portion E" extending toward the second conductive element 95.

In the foregoing description of an example embodiment, the via structure 80" may be described as being divided into the conductive via 85' and the via extension portion E". However, as described above with reference to FIG. 3, the via structure 80" may also be described as being divided into a portion (for example, a first sub-via) thereof disposed in the first insulating layer 61a, and a portion (for example, a second sub-via) thereof disposed in the second insulating layer 61b. In an example embodiment, the second sub-via may be understood as having an extended portion E", such that a contact area between the via structure 80" and the second conductive element 95 may increase.

Methods of manufacturing the semiconductor devices 10A and 10B illustrated in FIGS. 3 and 4 will be described hereinafter. In describing the manufacturing methods of the semiconductor devices 10A and 10B, the structural features of the semiconductor devices 10A and 10B may be understood more clearly.

FIGS. 5A, 5B, 5C, 5D, 5E, and 5F are cross-sectional views illustrating the method of manufacturing the semiconductor device 10A illustrated in FIG. 3.

Figure 5A:
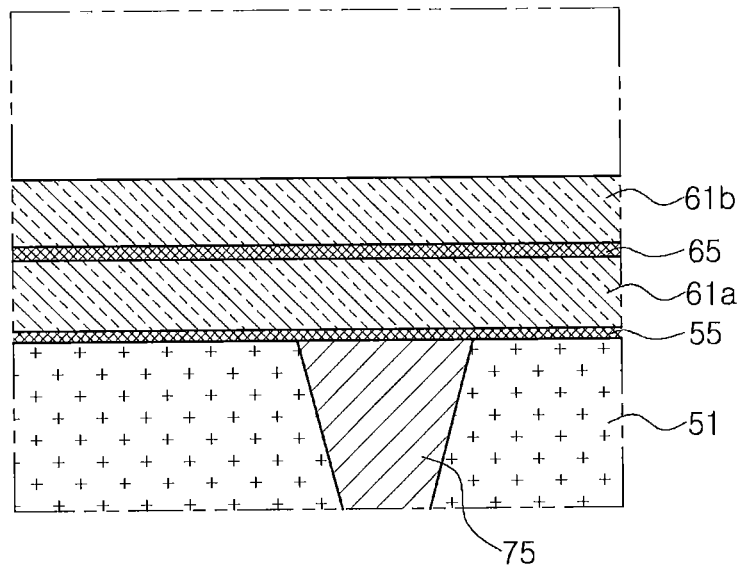
FIGS. 5A, 5B, 5C, 5D, 5E, and 5F are cross-sectional views illustrating a method of manufacturing the semiconductor device illustrated in FIG. 3.

Referring to FIG. 5A, first and second insulating layers 61a and 61b may be sequentially formed on a lower insulating layer 51 in which a first conductive element 75 may be disposed. Additionally, a first etch stop layer 55 may be formed between the lower insulating layer 51 and the first insulating layer 61a, and a second etch stop layer 65 may be formed between the first insulating layer 61a and the second insulating layer 61b.

The first conductive element 75 may be a contact plug or a conductive line. The lower insulating layer 51 may include, for example, a TEOS layer, a USG layer, a PSG layer, a BSG layer, a BPSG layer, a FSG layer, a SOG layer, a TOSZ layer, or combinations thereof. Each of the first and second insulating layers 61a and 61b may be a low-k layer, such as, for example, a SiOC layer, SiCOH layer, or combinations thereof. At least one of the first and second etch stop layers 55 and 65 may include a silicon nitride, such as $SiN_x$, or an aluminum nitride (AlN). Such layers may be formed using a chemical vapor deposition (CVD) process or a spin coating process.

Figure 5B:
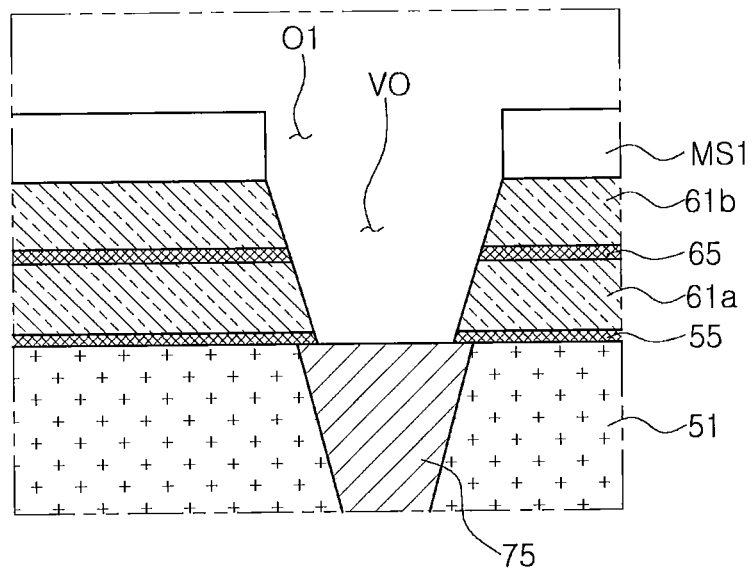

Subsequently, as illustrated in FIG. 5B, a via hole VO may be formed through the first and second insulating layers 61a and 61b.

The via hole VO may define a contact region of the first conductive element 75. As illustrated in FIG. 5B, a desired via hole VO may be formed by forming, on the second insulating layer 61b, a first mask MS1 having a first opening O1 that may define a region of the via hole VO and by applying a selective etching process using the first mask MS1.

Subsequently, a process of forming a trench VE connected to the via hole VO in the second insulating layer 61b may be performed.

Figure 5C:
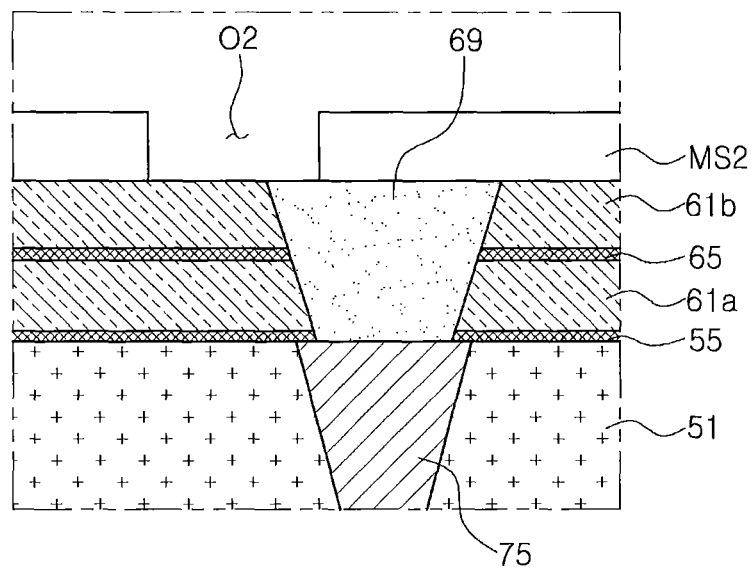

First, as illustrated in FIG. 5C, a filling portion 69 may be formed in the previously formed via hole VO, and a second mask MS2 having a second opening O2 that may define the trench VE may be formed. The filling portion 69 may be formed using a planarization process, such as a chemical mechanical polishing (CMP) process, or an etch-back process after depositing a material, such as SOH.

Figure 5D:
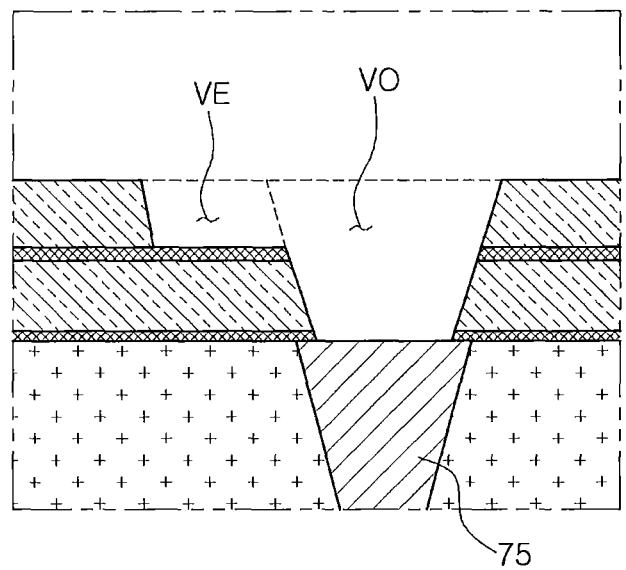

Subsequently, a via hole VO connected to the trench VE may be formed by removing the filling portion 69 after a selective etching process using the second mask MS2, as illustrated in FIG. 5D. Unlike the etching process used in FIG. 5B, the present etching process may substantially limit a formation region of the trench VE to the second insulating layer 61b by selectively removing a portion of the second insulating layer 61b using the second etch stop layer 65.

In general, a region in which a via is desired to be expanded to increase a contact area may have other component (for example, a gate structure) disposed therebelow, rather than a desired contact area. Thus, the trench VE formation process to expand the via may cause damage to other component or a short circuit. The second etch stop layer 65 may be used to reliably prevent such a defect. In detail, as illustrated in FIG. 5D, the trench VE may be formed along an upper surface of the second etch stop layer 65. In the present etching process, a portion of the second etch stop layer 65, having a reduced thickness, may be removed. Thus, the trench VE may be illustrated as being formed along an upper surface of the first insulating layer 61a.

Figure 5E:
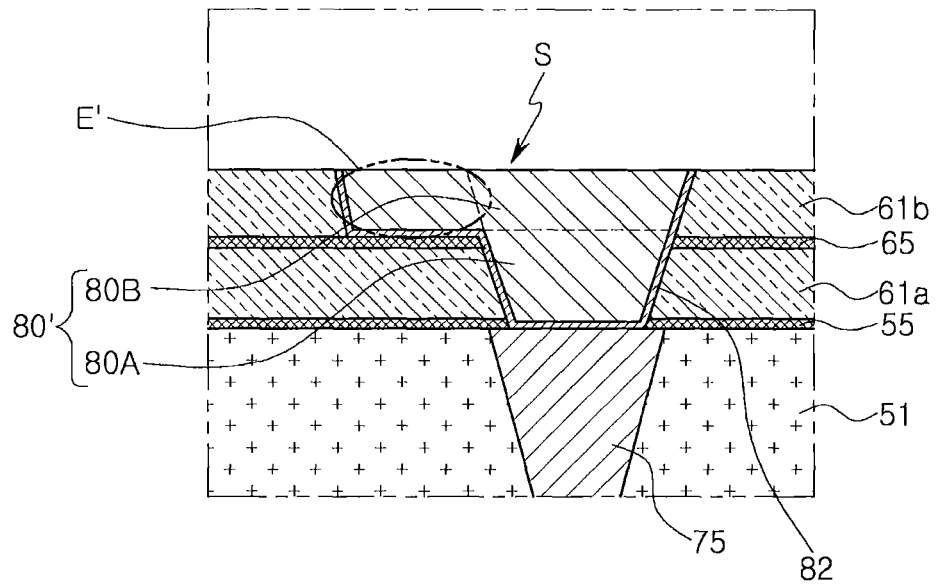

Subsequently, as illustrated in FIG. 5E, the via hole VO and the trench VE connected thereto may be filled with a metal to form a via structure 80'.

The present process may include a process of forming a first conductive barrier 82 on surfaces of the via hole VO and the trench VE before filling the metal. The present process may be performed by forming the first conductive barrier 82 using a metal nitride, such as TiN, TaN, or WN, depositing a metal, such as Cu or W, so as to fill the via hole VO and the trench VE, and removing a deposition disposed on an upper surface of the second insulating layer 61b outside the via hole VO and the trench VE using a planarization process, such as a chemical mechanical polishing (CMP) process. A surface of the via structure 80', according to an example embodiment, may be coplanar with the upper surface of the second insulating layer 61b.

As described above, the via hole VO and the trench VE may be filled using a single process. Thus, the via structure 80' may form a single structure (an integrated structure). The integrated structure may be, as described above, divided into a first sub-via 80A disposed in the first insulating layer 61a, and a second sub-via 80B disposed in the second insulating layer 61b, and the second sub-via 80B may have an extended portion E' to increase a contact area between the via structure 80' and a second conductive element 95 of FIG. 5F.

Figure 5F:
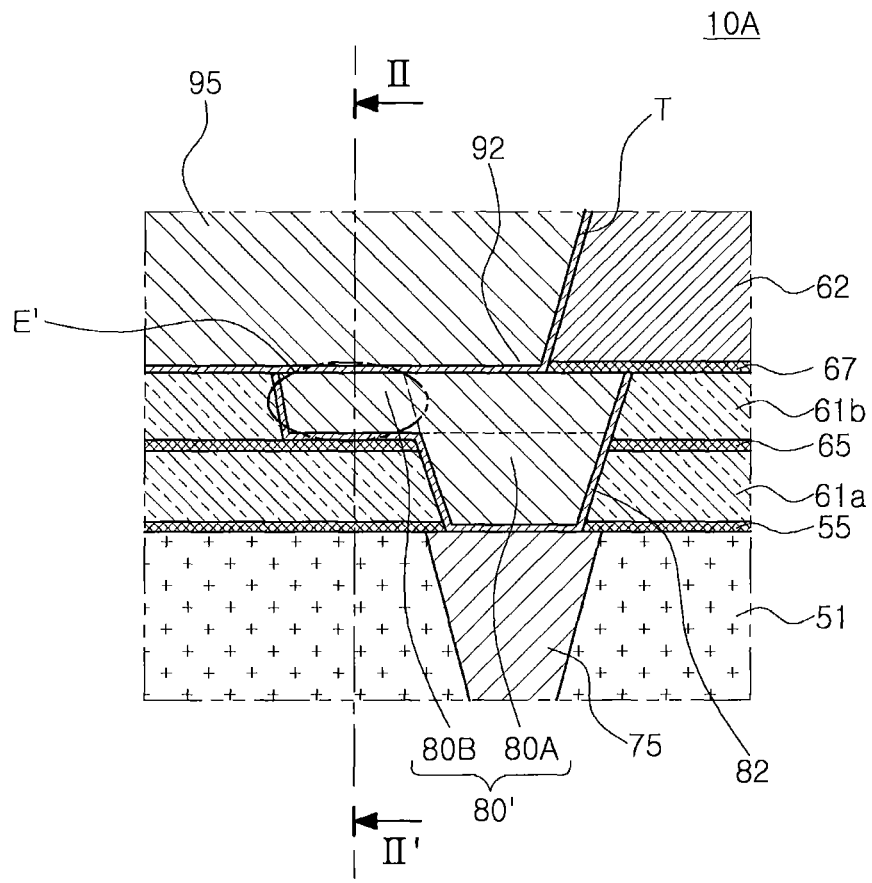

Subsequently, as illustrated in FIG. 5F, the second conductive element 95 connected to the via structure 80' may be formed.

This process may sequentially form a third etch stop layer 67 and an upper insulating layer 62 on the second insulating layer 61b, and may form a desired second conductive element 95 by patterning the upper insulating layer 62. Prior to forming the second conductive element 95, an additional second conductive barrier 92 may be formed.

The second conductive element 95 may be in contact with the extended portion E' of the via structure 80'. The extended portion E' may be disposed in a direction in which the second conductive element 95 may extend. Thus, the contact area between the second conductive element 95 and the via structure 80' may increase. The second conductive element 95 may be a metal line of a back end of line (BEOL), and may be formed of a metal, such as Cu or W.

FIGS. 6A, 6B, 6C, and 6D are cross-sectional views illustrating the method of manufacturing the semiconductor device 10B illustrated in FIG. 4.

Figure 6A:
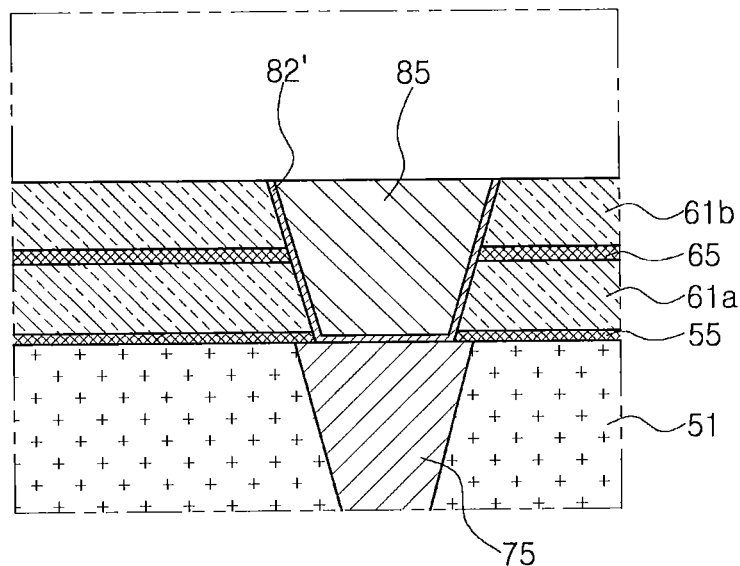
FIGS. 6A, 6B, 6C, and 6D are cross-sectional views illustrating a method of manufacturing the semiconductor device illustrated in FIG. 4.

Referring to FIG. 6A, a conductive via 85 connected to a first conductive element 75 while passing through first and second insulating layers 61a and 61b is illustrated.

The conductive via 85 may be understood as having a structure obtained using the planarization process, such the chemical mechanical polishing (CMP) process, after applying the insulating layer formation process and the via hole formation process (refer to FIGS. 5A and 5B), according to the previous example embodiment, and then the metal filling process for the via hole VO. Prior to the metal filling process, a first conductive barrier 82' may be formed. The first conductive barrier 82' may surround a side surface and a lower surface of the conductive via 85.

Figure 6B:
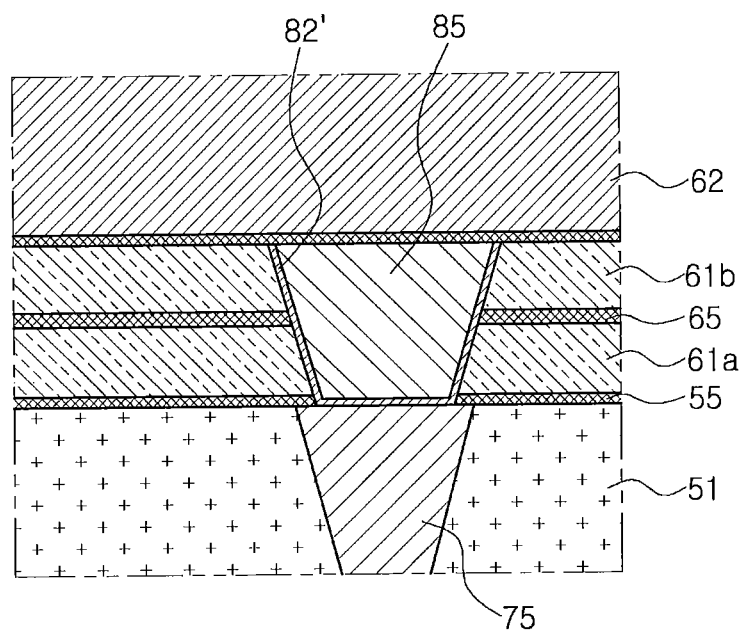

Subsequently, as illustrated in FIG. 6B, a third etch stop layer 67 and an upper insulating layer 62 may be sequentially formed on the second insulating layer 61b.

Figure 6C:
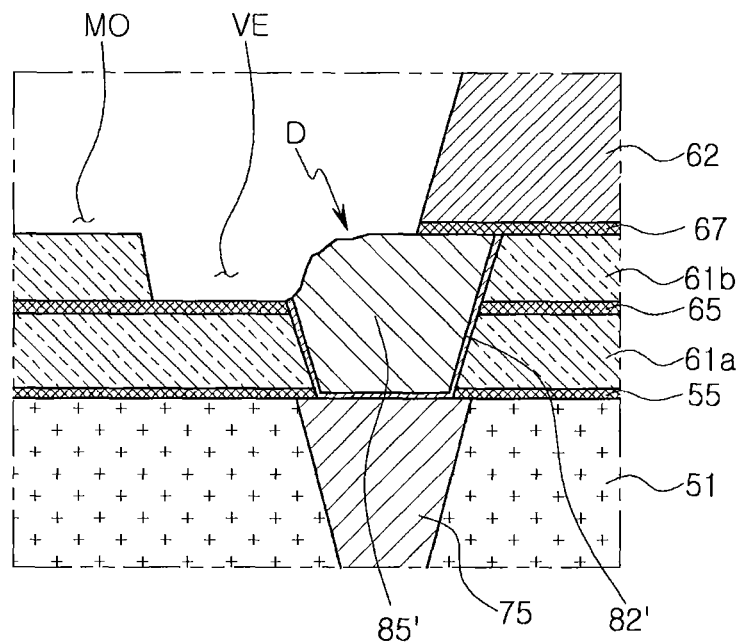

Subsequently, as illustrated in FIG. 6C, a first trench VE for a via extension portion and a second trench MO for a second conductive line may be formed using a dual damascene process.

The present process may be performed in the order of forming a region including the first trench VE to pass through the upper insulating layer 62 and the second insulating layer 61b and forming the second trench MO. However, the present process is not limited to the order detailed herein, and may be performed in the opposite order.

In the process of forming the first trench VE, a portion of the previously formed conductive via 85 may be removed. A surface of the conductive via 85 from which the portion of the conductive via 85 is removed may be an inclined surface D. The inclined surface D may be slightly inclined upwardly. In an example embodiment, the inclined surface D may be obtained using an etching process, thereby being non-uniform. In the present process, at an interface between the first trench VE and the second trench MO, widths of the two trenches in one direction may be substantially the same. This will be described later with reference to FIG. 8.

Figure 6D:
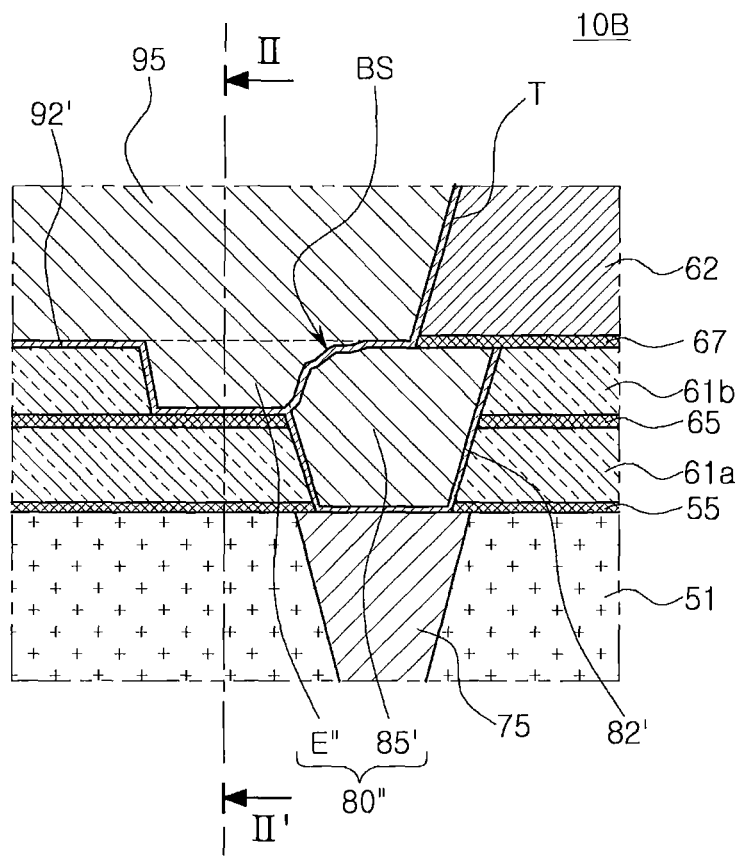

Subsequently, as illustrated in FIG. 6D, the first trench VE and the second trench MO may be filled with a metal to form a via extension portion E" and a second conductive element 95 together.

Prior to the present metal filling process, a process of forming a second conductive barrier 92' on surfaces of the first trench VE and the second trench MO may be performed. The first conductive barrier 82' may be formed using a metal nitride, such as TiN, TaN, or WN.

Subsequently, the present process may be performed by depositing a metal, such as Cu or W, so as to fill the first trench VE and the second trench MO, and then removing a deposition disposed on an upper surface of the upper insulating layer 62 outside the second trench MO, using a planarization process, such as a CMP process.

The present filling process may be performed using a single process. Thus, the second conductive element 95 may be integrated with the extended portion E' of a via structure 80". The via extension portion E" and the second conductive element 95 may form a single structure (an integrated structure).

Further, the second conductive barrier 92' may extend along an interface BS between the conductive via 85' and the via extension portion E". For example, in an example embodiment, a portion of the second conductive barrier 92' may be present between the conductive via 85' and the via extension portion E".

In an example embodiment, an upper surface of the via extension portion E" may be determined by an upper surface area of the first trench VE, and the upper surface area of the first trench VE may define a contact area between the via structure 80" and the second conductive element 95.

Figure 7:
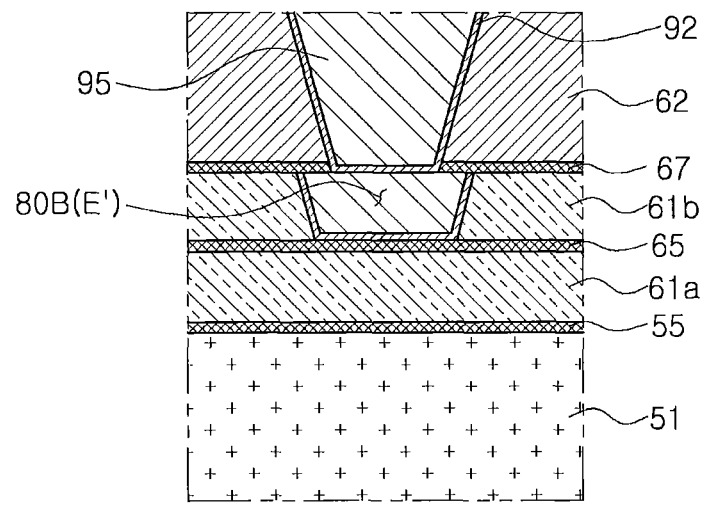
FIG. 7 is a cross-sectional view of the semiconductor device taken along line II-II' of FIG. 5F.
Figure 8:
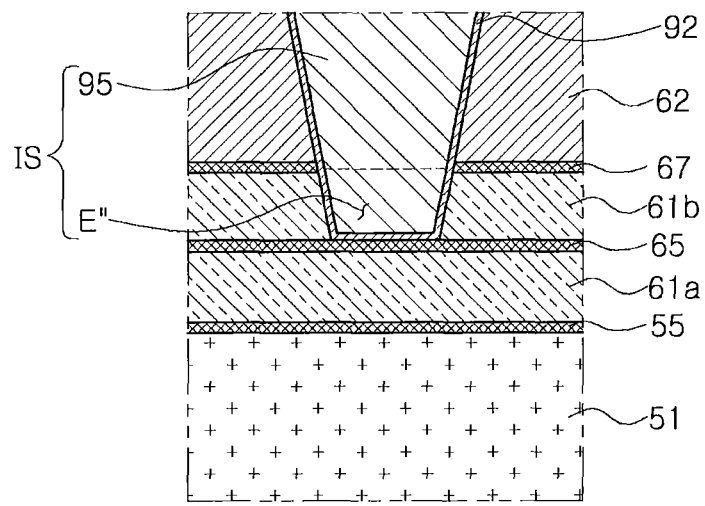
FIG. 8 is a cross-sectional view of the semiconductor device taken along line II-II' of FIG. 6D.

FIG. 7 is a cross-sectional view of the semiconductor device 10A taken along line II-II' of FIG. 5F, and FIG. 8 is a cross-sectional view of the semiconductor device 10B taken along line II-II' of FIG. 6D.

As described above, in the trench formation process of FIG. 6C, the widths of the first trench VE and the second trench MO at the interface between the two trenches in the one direction may be substantially the same, according to conditions of the dual damascene process.

As a result, as illustrated in FIG. 8, at the interface between the via extension portion E" and the second conductive element 95, a width of the via extension portion E" may be substantially the same as that of the second conductive element 95. As illustrated in FIG. 8, The via extension portion E' and the second conductive element 95 may form a single structure, which may be an integrated structure IS. As illustrated in FIG. 7, in the previous example embodiment, the second conductive element 95 may be formed using a process different from a process of forming the extended portion E' of the via structure 80'. As a result, the second conductive element 95 and the extended portion E' may have different widths at the interface therebetween.

Design of a mask or the like used during the trench formation process may make a difference in such features. As in the processes illustrated in FIGS. 6A through 6D, when the second conductive element 95 and the via extension portion E" are formed together using the dual damascene process, the widths of the second conductive element 95 and the via extension portion E" at the interface therebetween in at least one direction may be the same as each other.

Figure 9A:
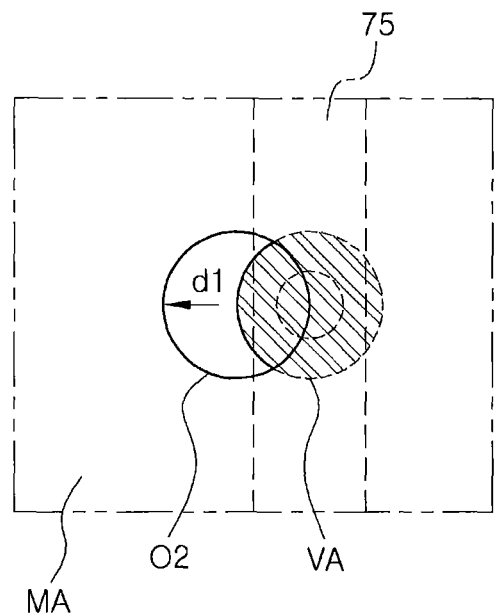
FIGS. 9A and 9B are plan views illustrating processes of forming via extension portions in a method of manufacturing a semiconductor device, according to various example embodiments, respectively.
Figure 9B:
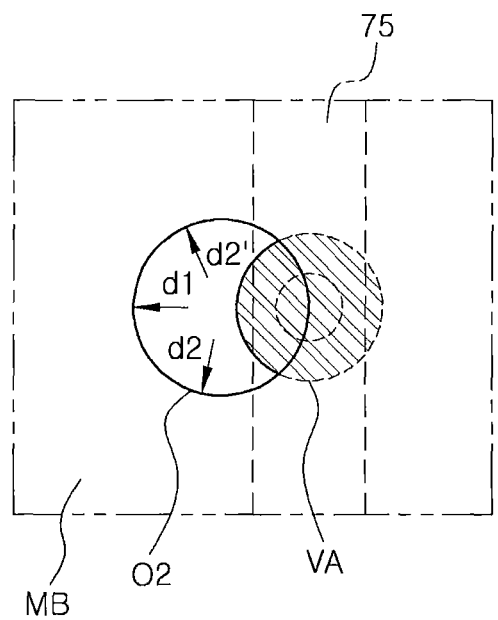

FIGS. 9A and 9B are plan views illustrating processes of forming via extension portions in a method of manufacturing a semiconductor device, according to various example embodiments, respectively. The processes of forming via extension portions illustrated in FIGS. 9A and 9B may be understood as a top view of the process illustrated in FIG. 5C.

FIGS. 9A and 9B illustrate masks MA and MB each defining a via extension portion for extending a contact area of a conductive via VA.

First, an opening O2 of the mask MA illustrated in FIG. 9A is illustrated as being set to have a size corresponding to that of the conductive via VA. The opening O2 of the mask MA may provide an opening region extending in a particular direction d1.

Figure 10A:
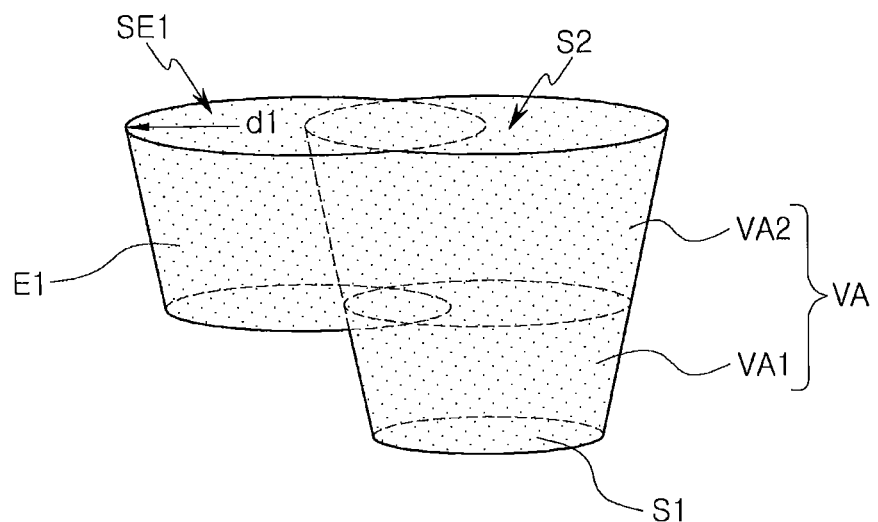
FIGS. 10A and 10B are schematic perspective views of via structures illustrated in FIGS. 9A and 9B, respectively.

In detail, as illustrated in FIG. 10A, a via extension portion E1 provided by the mask MA illustrated in FIG. 9A may provide an upper surface area SE1 extending in the particular direction d1, compared to an upper surface area S2 of the conductive via VA.

An opening O2 of the mask MB illustrated in FIG. 9B is illustrated as being reset to have a size greater than that of the conductive via VA. The opening O2 of the mask MB may provide an opening region extending in another direction d2, adjacent to the particular direction d1, in addition to the particular direction d1.

Figure 10B:
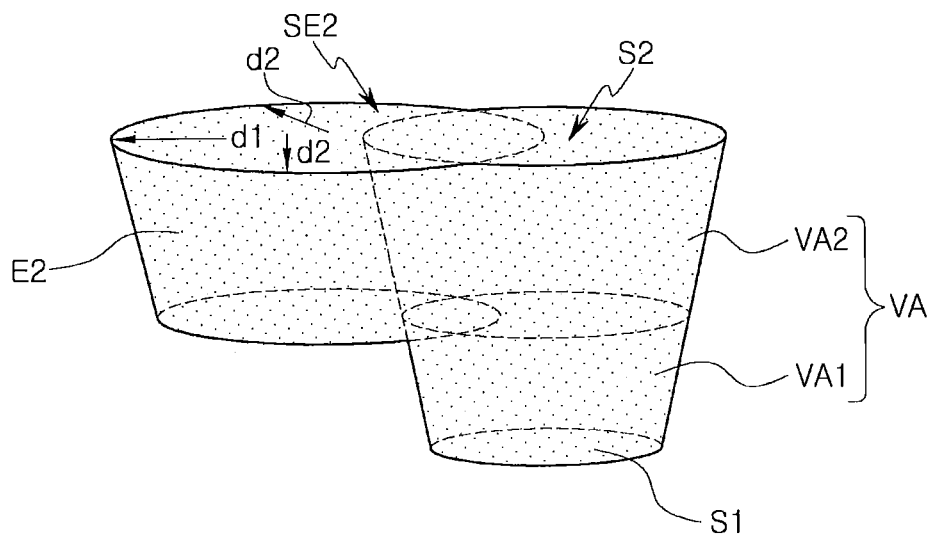

In detail, as illustrated in FIG. 10B, a via extension portion E2 provided by the mask MB illustrated in FIG. 9B may provide an upper surface area SE2 extending in the other direction d2, as well as in the particular direction d1, compared to the upper surface area S2 of the conductive via VA.

An error may occur due to an optical proximity effect of a photolithography process. Thus, deviations in layout patterns may occur. This may also occur in a direction in addition to the direction in which the second conductive element may extend. Considering such a bias, the via extension portion E2 may have an extended area, as illustrated in FIGS. 9B and 10B.

Figure 11:
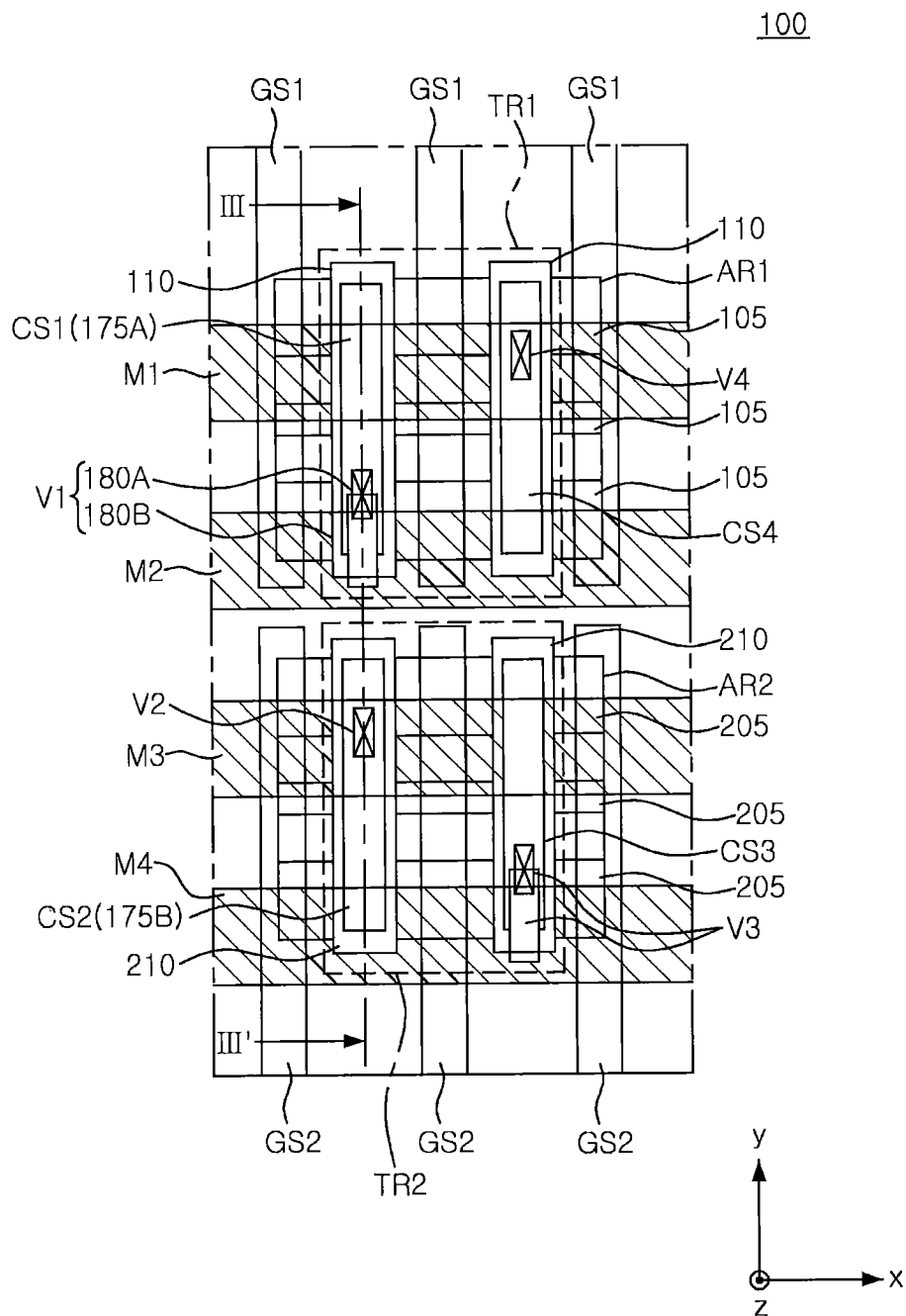
FIG. 11 is a flat layout diagram illustrating primary components of a semiconductor device, according to example embodiments.
Figure 12:
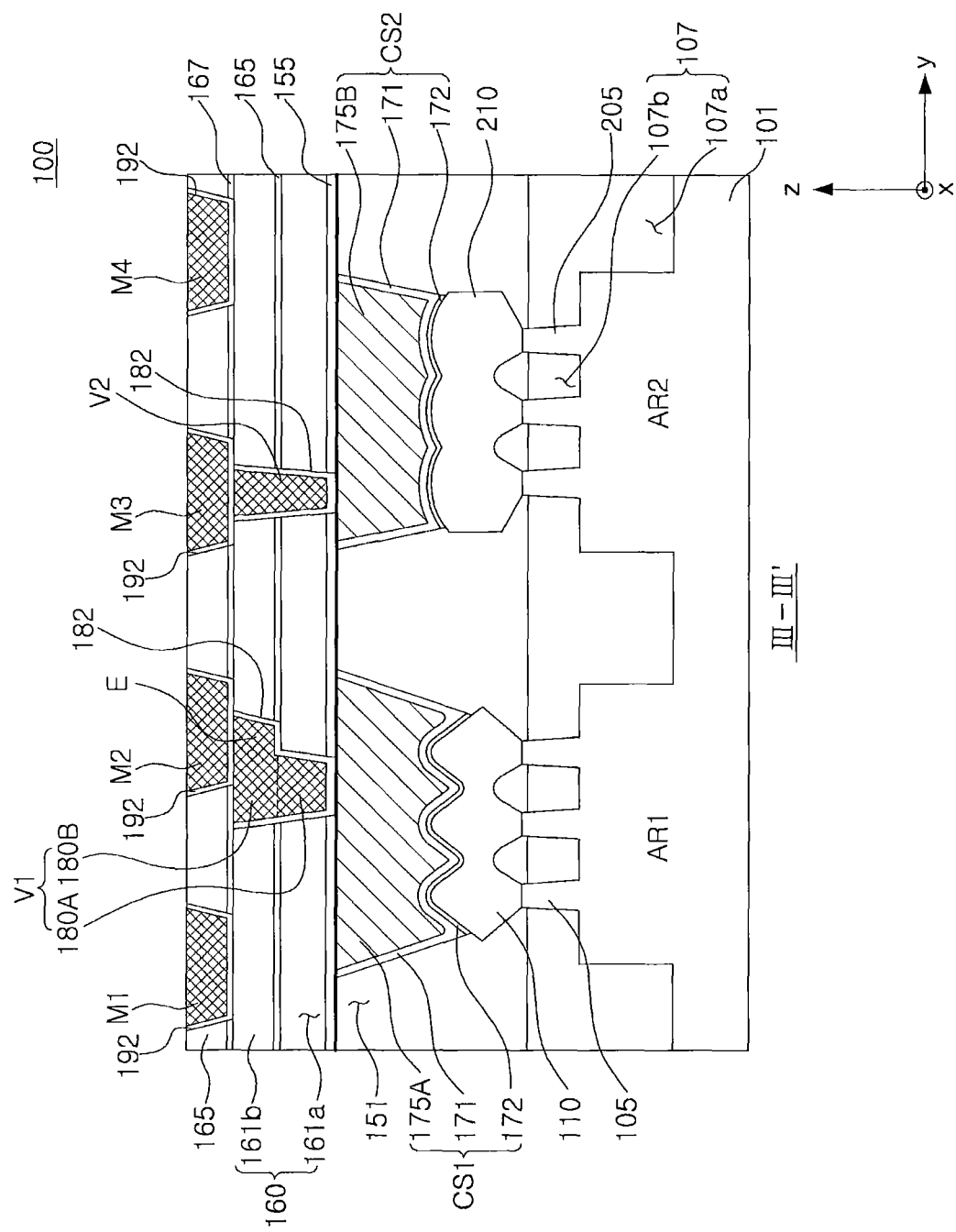
FIG. 12 is a cross-sectional view of the semiconductor device taken along line of FIG. 11.

FIG. 11 is a flat layout diagram illustrating primary components of a semiconductor device, according to example embodiments. FIG. 12 is a cross-sectional view of the semiconductor device taken along line III-III' of FIG. 11.

Referring to FIGS. 11 and 12, a semiconductor device 100, according to an example embodiment, may include a first active region AR1, a second active region AR2, and a device isolation region 107, disposed on a substrate 101.

In an example embodiment, the substrate 101 may include a semiconductor, such as Si or Ge, or a compound semiconductor, such as SiGe, SiC, GaAs, InAs, or InP. In another example embodiment, the substrate 101 may have a silicon on insulator (SOI) structure. Each of the first and second active regions AR1 and AR2 may be a conductive region, such as a well doped with an impurity or a structure doped with an impurity. In an example embodiment, an example is not limited thereto, and the first active region AR1 may be an n-type well for a PMOS transistor, and the second active region AR2 may be a p-type well for an NMOS transistor.

A first active fin 105 may be disposed on an upper surface of the first active region AR1, and a second active fin 205 may be disposed on an upper surface of the second active region AR2. Each of the first and second active fins 105 and 205 may have a structure protruding from an upper surface of each of the first and second active regions AR1 and AR2 to an upper portion (in a z-direction). In an example embodiment, each of the first and second active fins 105 and 205 may be provided as three active fins, but the present disclosure is not limited thereto. In another example embodiment, each of the first and second active fins 105 and 205 may be provided as a single active fin or a different number of active fins.

As illustrated in FIG. 11, each of the first active fin 105 and the second active fin 205 may extend from each of the first active region AR1 and the second active region AR2 in parallel in a first direction (an x direction). Each of the first active fin 105 and the second active fin 205 may be provided as an active region of each transistor.

The device separation region 107 may define the first and second active regions AR1 and AR2. The device separation region 107 may include a silicon oxide or a silicon oxide-based insulating material. The device separation region 107 may include a first isolation region 107a defining an active region and a second isolation region 107b defining the first active fin 105 and the second active fin 205. The first isolation region 107a may have a bottom surface deeper than that of the second isolation region 107b.

The first isolation region 107a may be referred to as deep trench isolation (DTI), and the second isolation region 107b may be referred to as shallow trench isolation (STI).

The second isolation region 107b may be disposed on the first and second active regions AR1 and AR2. While the first active fin 105 and the second active fin 205 pass through the second isolation region 107b, portions thereof may protrude to an upper portion of the second isolation region 107b.

The semiconductor device 100, according to an example embodiment, may include a first gate structure GS1 and a second gate structure GS2. As illustrated in FIG. 11, each of the first and second gate structures GS1 and GS2 may have a line shape extending in a second direction (a y direction) intersecting the first direction (the x direction). The first gate structure GS1 may overlap a portion of the first active fin 105, and the second gate structure GS2 may overlap a portion of the second active fin 205.

The semiconductor device 100, according to an example embodiment, may include a first source/drain region 110, a second source/drain region 210, and a first contact structure CS1, a second contact structure CS2, a third contact structure CS3, and a fourth contact structure CS4 connected to the first and second source/drain regions 110 and 210. The first and second source/drain regions 110 and 210 may be formed in portions of the first and second active fins 105 and 205 disposed on both sides of the first and second gate structures GS1 and GS2, respectively.

In an example embodiment, forming the first and second source/drain regions 110 and 210 may include forming recesses in portions of the first and second active fins 105 and 205, and performing selective epitaxial growth (SEG) on the recesses'. The first and second source/drain regions 110 and 210 may be formed of Si, SiGe, or Ge, and may have any one of n-type or p-type conductivity.

The second source/drain region 210 may have a material and/or shape different from that of the first source/drain regions 110. For example, when the semiconductor device 100 is a PMOS transistor, the first source/drain region 110 may include silicon germanium (SiGe), and may be doped with a p-type impurity. For example, when the semiconductor device 100 is an NMOS transistor, the second source/drain region 210 may include silicon, and may be doped with an n-type impurity.

In an example embodiment, the first source/drain region 110 may be formed of SiGe, and may be doped with a p-type impurity, for example, boron (B), indium (In), gallium (Ga), or the like. The second source/drain region 210 may be formed of silicon (Si), and may be doped with an n-type impurity, for example, phosphorus (P), nitrogen (N), arsenic (As), antimony (Sb), or the like. The first source/drain region 110 and the second source/drain region 210 may have different shapes along a crystallographically stable surface during a growth process. As illustrated in FIG. 12, a cross section (in the z direction) of the first source/drain region 110 may have a pentagonal shape, and a cross section (in the z direction) of the second source/drain region 210 may be a hexagonal shape or a polygonal shape having a gentle angle.

As described above, a first FinFET TR1 including the first gate structure GS1 and the first source/drain region 110 with the first active fin 105 may be formed on the first active region AR1, and a second FinFET TR2 including the second gate structure GS2 and the second source/drain region 210 with the second active fin 205 may be formed on the second active region AR2.

The semiconductor device 100, according to an example embodiment, may have an interlayer insulating layer 151 disposed on the device separation region 107. The interlayer insulating layer 151 may be disposed around the first and second gate structures GS1 and GS2. For example, the interlayer insulating layer 151 may include a TEOS layer, a USG layer, a PSG layer, a BSG layer, a BPSG layer, a FSG layer, a SOG layer, a TOSZ layer, or combinations thereof. The interlayer insulating layer 151 may be formed using a chemical vapor deposition (CVD) process or a spin coating process.

In an example embodiment, the first to fourth contact structures CS1 to CS4 may be formed through the interlayer insulating layer 151, and may be connected to the first and second source/drain regions 110 and 210, respectively. In detail, the first and third contact structures CS1 and CS3 may be connected to the first source/drain region 110 of the first FinFET TR1, and the second and fourth contact structure CS2 and CS4 may be connected to the second source/drain region 210 of the second FinFET TR2.

As illustrated in FIG. 12, each of the first and second contact structures CS1 and CS2 may include a first conductive barrier 171, a metal silicide layer 172, a first contact plug 175A, and a second contact plug 175B. The first conductive barrier 171 may cover a side surface and a lower surface of each of the first and second contact plugs 175A and 175B. The metal silicide layer 172 may be disposed between the first conductive barrier 171 and each of the first and second source/drain regions 110 and 210. For example, the first conductive barrier 171 may be formed of a metal nitride, such as TiN, TaN, WN, or the like. The metal silicide layer 172 may be formed of a material, such as CoSi, NiSi, TiSi, or the like. The first and second contact plugs 175A and 175B may be formed of tungsten (W), cobalt (Co), titanium (Ti), alloys thereof, or combinations thereof. Similarly, the third and fourth contact structures CS3 and CS4 may be formed.

The semiconductor device 100, according to an example embodiment, may include an interconnection structure connecting a conductive line to a contact plug. The interconnection structure may include a metal via positioned in a contact point of the conductive line, and a via connection layer connecting the metal via to the contact plug.

Referring to FIGS. 11 and 12, a first metal line M1, a second metal line M2, a third metal line M3, and a fourth metal line M4 may be disposed on the first and second FinFETs TR1 and TR2, and may extend in the first direction (the x direction). The first to fourth metal lines M1 to M4 may be connected to the first to fourth contact structures CS1 to CS4, respectively, by first to fourth via structures V1 to V4.

The first to fourth metal lines M1 to M4 may be formed in a low-k layer 165. The low-k layer 165 employed in an example embodiment may include a first insulating layer 161a and a second insulating layer 161b disposed on the interlayer insulating layer 151. The low-k layer 165 may have the first to fourth metal lines M1 to M4 formed therein.

The first and second insulating layers 161a and 161b may have the first to fourth via structures V1 to V4 formed therein. At least one of the first and second insulating layers 161a and 161b and the low-k layer 165 may include a SiOC layer, a SiCOH layer, or combinations thereof Further, at least one of the first to fourth metal lines M1 to M4 and the first to fourth via structures V1 to V4 may include copper or a copper-containing alloy. The first to fourth metal lines M1 to M4 and the first to fourth via structures V1 to V4 may be formed using a single damascene process, respectively (refer to FIGS. 5A to 5F) or may be formed simultaneously using a dual damascene process (refer to FIGS. 6A through 6D).

As in an example embodiment, a first etch stop layer 155 disposed between the interlayer insulating layer 151 and the first insulating layer 161a may be further included. The first etch stop layer 155 may not only stop etching, but may also prevent metals (for example, Cu or W) forming the first to fourth metal lines M1 to M4 and the first to fourth via structures V1 to V4 from diffusing to a lower region. For example, the first etch stop layer 155 is not limited thereto, and may include an aluminum nitride (AlN).

Referring to FIG. 12, the first contact plug 175A may be connected to the second metal line M2 through the first via structure V1. The first via structure V1 may include a first sub-via 180A and a second sub-via 180B. The first sub-via 180A may be connected to the first contact plug 175A. The second metal line M2 may have an insufficient overlap region of the first sub-via 180A, compared to having a desired level of contact resistance.

In an example embodiment, the second sub-via 180B disposed on the first sub-via 180A may have a via extension portion E. Thus, the second sub-via 180B may have a sufficient contact area with respect to the second metal line M2. As in the related art, the third metal line M3 having a sufficient contact area may not be required to have a via extension portion.

As illustrated in FIG. 11, an interconnection structure between the fourth metal line M4 and the third contact structure CS3 may have a structure similar to that of the first via structure V1 between the first metal line M1 and the first contact structure CS1.

As set forth above, according to example embodiments of the present disclosure, a sufficient overlap region of an upper surface of a via and a conductive element (for example, a metal line) may be secured without an increase of a lower width of the via in implementing a vertical interconnection structure. Thus, a level of contact resistance may be reduced, and a short circuit between the conductive element and a component adjacent thereto may be reduced.

While example embodiments have been shown and described above, it will be apparent to those skilled in the art that modifications and variations could be made without departing from the scope of the present disclosure of inventive concepts, as defined by the appended claims.

What is claimed is:

1. A method of fabricating a semiconductor device, the method comprising:
    forming a first insulating layer on a base insulating layer in which a first conductive element is disposed;
    forming a second insulating layer on the first insulating layer;
    forming a via hole through the first and second insulating layers, the via hole connecting to a region of the first conductive element;
    forming a trench in the second insulating layer, the trench extending along an upper surface of the first insulating layer from one side surface of the via hole;
    filling the via hole and the trench with a metal to form a via structure, wherein the via structure is connected to the region of the first conductive element and includes a first portion in the via hole and a second portion in the trench; and
    forming a second conductive element connected to the second portion of the via structure.

2. The method of claim 1, further comprising, before the forming of the trench, filling a sacrificial material in the via hole and planarizing the sacrificial material with an upper surface of the second insulating layer.

3. The method of claim 2, further comprising, after the forming of the trench, removing the sacrificial material in the via hole.

4. The method of claim 1, further comprising forming an etch stop layer on the first insulating layer between the forming of the first insulating layer and the forming of the second insulating layer.

5. The method of claim 4, wherein the forming of the trench comprises removing a portion of the second insulating layer using the etch stop layer, and wherein the portion of the second insulating layer is adjacent to the one side surface of the via hole.

6. The method of claim 1, wherein the second conductive element extends in a first direction orthogonal to the via hole, and wherein the trench extends in the first direction adjacent to the second conductive element.

7. The method of claim 1, wherein the second conductive element extends over an upper surface of the second portion of the via structure to an upper surface of the first portion of the via structure.

8. The method of claim 1, further comprising forming a conductive barrier on inner surfaces of the via hole and the trench before the filling of the via hole and the trench with the metal to form the via structure.

9. The method of claim 8, wherein the first portion of the via structure and the second portion of the via structure are provided as an integrated via structure.

10. The method of claim 1, wherein an upper surface of the via structure is substantially coplanar with an upper surface of the second insulating layer.

11. The method of claim 1, wherein the first conductive element includes a contact plug connected to an active region of a substrate, or a conductive line extending in a direction.

12. A method of fabricating a semiconductor device, the method comprising:
    sequentially forming first and second insulating layers on a lower insulating layer in which a first conductive element is disposed;
    forming a via hole through the first and second insulating layers, the via hole connecting to a region of the first conductive element;
    filling the via hole with a metal to form a conductive via connected to the region of the first conductive element;
    forming an upper insulating layer on the conductive via and the second insulating layer;
    forming a first trench for a second conductive element in the upper insulating layer;
    forming a second trench in a portion of the second insulating layer, wherein the second trench connects to the conductive via; and
    filling the first trench and the second trench with the second conductive element to form a metal line in the upper insulating layer and a via extension portion in the second trench.

13. The method of claim 12, wherein the via extension portion and the second conductive element are provided as an integrated structure.

14. The method of claim 12, wherein, at an interface between the via extension portion and the second conductive element, a width of the via extension portion is substantially equal to a width of the second conductive element.

15. The method of claim 12, wherein the forming of the second trench comprises removing a portion of the conductive via.

16. The method of claim 12, wherein the second conductive element extends in a first direction orthogonal to the via hole, and the second trench extends in the first direction adjacent to the second conductive element.

17. The method of claim 12, further comprising forming a first conductive barrier on a lower surface and a side surface of the conductive via before the filling the via hole; and forming a second conductive barrier on a lower surface and a side surface of the via extension portion before the filling the first trench and the second trench.

18. The method of claim 17, wherein the second conductive barrier extends along a side surface of the second conductive element, and wherein a lower surface of the second conductive element is in the second insulating layer.

19. The method of claim 18, wherein the second conductive barrier extends along an interface between the conductive via and the via extension portion.

20. The method of claim 19, wherein between the conductive via and the via extension portion comprises an inclined surface.

* * * * *